(12) United States Patent
Heid (10) Patent No.: US 6,504,374 B2
(45) Date of Patent: Jan. 7, 2003

(54) CONTROL CIRCUIT DEVICE, PARTICULARLY FOR A GRADIENT SYSTEM OF A MAGNETIC RESONANCE APPARATUS

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/859,255

(22) Filed: May 17, 2001

(65) Prior Publication Data

US 2002/0017903 A1 Feb. 14, 2002

(30) Foreign Application Priority Data

May 22, 2000 (DE) .......................................... 100 25 284

(51) Int. Cl.[7] .................................................. G01V 3/00
(52) U.S. Cl. ........................ 324/322; 324/309; 324/318
(58) Field of Search ................................. 324/322, 318, 324/309, 307, 320; 341/118

(56) References Cited

U.S. PATENT DOCUMENTS

| 5,442,290 A | * | 8/1995 | Crooks .......................... 324/309 |
| 6,025,720 A | * | 2/2000 | Lenz et al. .................... 324/322 |
| 6,154,031 A | * | 11/2000 | Raymon ....................... 324/322 |
| 6,285,304 B1 | | 9/2001 | Schweighofer | |

OTHER PUBLICATIONS

"Grundlagen der Regelungstechnik,"Schimdt, (1987) pp. 92–96 and 173–180, relied only on the description of these articles provided in the specification. English translation of these articles is not provided by the applicant..

"Taschenbuch der Regelungstechnik," Lutz et al (1988) pp. 417–422, relied only on the description of these articles provided in the specification. English translation of these articles is not provided by the applicant..

"Bildgebende Systeme für die Medizinische Diagnostik," Morneburg (1995) pp. 521–540, relied only on the description of these articles provided in the specification. English translation of these articles is not provided by the applicant.

* cited by examiner

Primary Examiner—Edward Lefkowitz
Assistant Examiner—Brij B. Shrivastav
(74) Attorney, Agent, or Firm—Schiff Hardin & Waite (57) ABSTRACT

A control circuit device, particularly for a gradient system of a magnetic resonance apparatus, has a command variable transformer to which a command variable is supplied and that generates a first output quantity that corresponds to a time integration of the command variable, a regulating variable transformer to which a regulating variable is supplied and that generates a second output quantity that corresponds to a time integration of the regulating variable, a comparator to which the two output quantities are supplied and that generates an actuating variable quantity from the output quantities, and a controller or regulator to which the actuating variable quantity is supplied and that generates a manipulated variable with which the regulating variable can be controlled or regulated.

23 Claims, 8 Drawing Sheets

CONTROL CIRCUIT DEVICE, PARTICULARLY FOR A GRADIENT SYSTEM OF A MAGNETIC RESONANCE APPARATUS

BACKGROUND OF THE INVENTION

1. Field of the Invention

The present invention is directed to a control circuit device, particularly for a gradient system of a magnetic resonance apparatus.

2. Description of the Prior Art

Control circuit devices are widespread in nearly all areas of technology, including magnetic resonance technology. For realizing controllers with digital means, for example, FIG. 3.12 in the book by G. Schmidt, "Grundlagen der Regelungstechnik", Berlin, Springer-Verlag, 1987, pp. 173–180, shows a schematic signal flow diagram of a digital controller. Further, a shift of an addition place within a signal flow diagram relating to the signal flow image algebra is described in the same book on pages 92–96. In base algorithms for digital controls, further, FIG. 11.2-10 in the book by H. Lutz and W. Wendt, "Taschenbuch der Regelungstechnik", Frankfurt am Main, Harri-Deutsch-Verlag, 1998, pages 417–427, shows a control circuit wherein an analog controlled quantity is fedback digitally converted onto an input of the control circuit.

In a magnetic resonance apparatus, a gradient field generated by a gradient system, which contains at least one gradient coil and a gradient amplifier, is rapidly switched. To that end, a gradient current generated by the gradient amplifier for the gradient coil is correspondingly regulated with a control circuit device. German OS 198 37 440 discloses a control circuit device for this purpose. In the control circuit device of this published application, a command variable generator generates a digital command variable that is supplied to a high-precision digital-to-analog converter for generating an analog command variable. Together with an analog measured quantity of the gradient current as a regulating variable, the analog command variable is supplied to an analog differential amplifier for forming an analog actuating variable quantity. The analog actuating variable quantity is supplied to an analog integrator for forming an analog, integrated actuating variable quantity. The analog, integrated actuating variable quantity is supplied to an analog-to-digital converter for forming a digital, integrated actuating variable quantity. The digital, integrated actuating variable quantity, finally, is supplied to a controller of a gradient amplifier, which emits the gradient current as a controlled output quantity.

Especially problematical in the above-described control circuit device is that the analog integrator tends to drift as a consequence of offset voltages and the high-precision digital-to-analog converter is not linked into the actual control loop, so that its imprecisions are not equalized.

SUMMARY OF THE INVENTION

An object of the present invention is to provide an improved control circuit device, particularly for a gradient system of a magnetic resonance apparatus, that, among other things, avoids the aforementioned disadvantages of known devices.

This object is inventively achieved in an inventive control circuit device, particularly for a gradient system of a magnetic resonance apparatus, having a command variable transformer to which a command variable is supplied and that is configured for generating a first output quantity that corresponds to a time integration of the command variable, a regulating variable transformer to which a regulating variable is supplied and that is configured for generating a second output quantity that corresponds to a time integration of the regulating variable, a comparator to which the two output quantities are supplied and that is configured for generating an actuating variable quantity from the output quantities, and a controller or regulator to which the actuating variable quantity is supplied and that is configured for generating a manipulated variable with which the regulating variable can be controlled or regulated via a controlled system.

In, for example, a magnetic resonance apparatus, a gradient current/time integral is employed as a regulating variable as a result so that the gradient current/time integral can be directly controlled as the quantity to which a spin ensemble to be investigated primarily reacts.

In an embodiment, the regulating variable transformer is a nuclear magnetic spin or electron spin magnetometer. To that end, at least parts of the nuclear magnetic spin or electron spin magnetometer are arranged within an electrical coil to which the regulated variable is supplied for generating a magnetic field.

The nuclear magnetic spin or electron spin magnetometer for, among other things, measuring a magnetic field which is adapted to receive a specimen of a material that produces nuclear magnetic resonance or electron spin resonance having a resonant frequency that is dependent on a magnetic flux density of the magnetic field to be measured, and has a transmission device for emitting a transmission signal into the specimen with at least one prescribable transmission frequency that has a frequency spacing from the resonant frequency, and a reception device for receiving a mixed signal with mixed frequencies containing the resonant frequency and the transmission frequency and for filtering out the resonant frequency from at least one of the mixed frequencies as a criterion (indicator) for the magnetic flux density.

A spin resonance of the specimen is thereby used as a non-linear component. The essentially fixed transmission frequency thus can be prescribed such tat the utilized mixed frequency of the mixed signal can be filtered out by a broadband filter having a short transmit time. A signal oscillating at the resonant frequency that represents an indicator or identifier for the magnetic flux density to be measured can be ultimately acquired by a following mixing of the filtered mixed signal with a signal oscillating with the transmission frequency. Among other things, magnetic fields that change arbitrarily fast in time thus can also be measured. A re-adjustment of the transmission frequency is not necessary, and therefore a control device for such readjustment is not necessary.

In an embodiment, the reception device of the magnetometer has a counter with which cycles of a signal that oscillates at the resonant frequency can be counted, and the counter is fashioned to emit a counter reading that is one indicator for the electrical charge of a current that corresponds to the magnetic field to be measured. When the specimen of the magnetometer is arranged within an electrical coil in which this current flows, a current-time integral of the current can be directly measured and is available as a digital quantity as the counter reading emitted by the counter.

In another embodiment, the transmission device of the magnetometer has a phase shifter for generating at least a 180° phase shift of the transmission signal. This 180° phase shift can thereby be generated either following a prescribable time duration or dependent on the amplitude of the mixed signal. As a result, the signal amplitude of the mixed signal, that decreases over time, is maintained at a relatively high level by re-exciting the spins in the specimen, so that a consistently high signal-to-noise ration can be achieved. In particular, the generation of 180° phase shifts dependent on the amplitude of the mixed signal has the advantage that changes in the $T_2$ decay time of the specimen—due, for example, to field inhomogeneities of the magnetic field to be measured—can be dynamically adapted.

In a further embodiment, the transmission device of the magnetometer is fashioned such that a magnetization amplitude of the transmission signal is smaller by factor of approximately $10^{-3}$ than the magnetic flux density to be measured. As a result, influence of the magnetization amplitude on the resonant frequency is negligible, so that it is not necessary to make a correction by a frequency component corresponding to the magnetization amplitude to be subsequently implemented for the resonant frequency that has been filtered out.

In another embodiment, the nuclear magnetic spin or electron spin magnetometer has a magnetic field generator for generating a static magnetic field the pre-polarizes the specimen. As a result, a magnetic flux density with a value of zero can be unambiguously identified and detected with the magnetometer.

DESCRIPTION OF THE PREFERRED EMBODIMENTS

Figure 1:
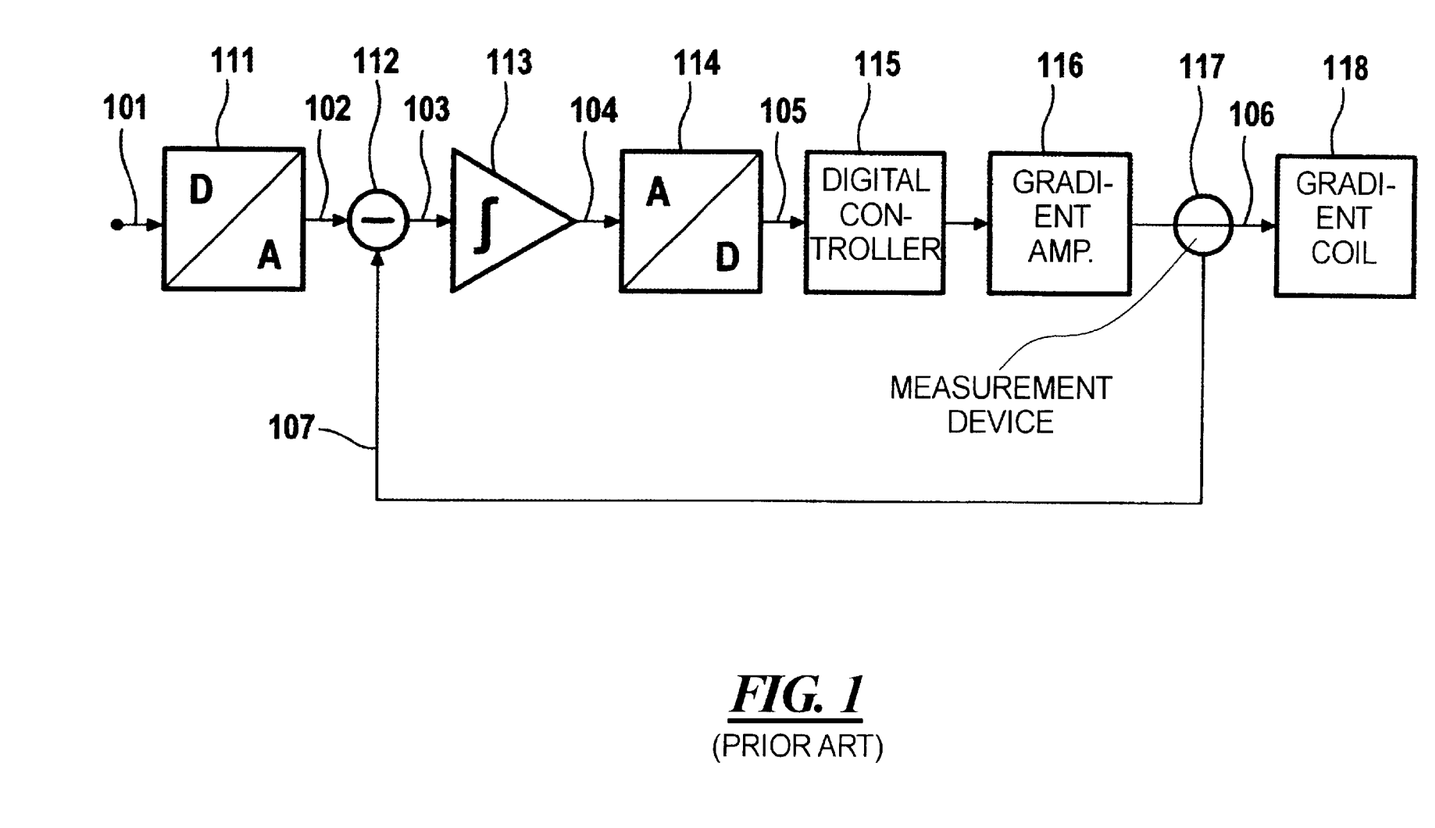
FIG. 1 is a block diagram of a control circuit device for a gradient system according to the prior art.

For comparison purposes, FIG. 1 shows a control circuit device for a known gradient system. A reference value of a gradient current, as digital command variable 101, is thereby supplied to a high-precision digital-to-analog converter 111—having a resolution of, for example 18 bits—for conversion into a corresponding analog command variable 102. The gradient current, as an analog controlled quantity 106, is measured with a measurement device 117 for forming an analog measured quantity 107 that corresponds to the controlled quantity 106. The measurement device 117 is implemented as an analog current transformer. The analog command variable 102 and the analog measured quantity 107 are supplied to an analog differential amplifier 112 for forming an analog actuating variable quantity 103. The analog actuating variable quantity 103 is supplied to an analog integrator 113 for forming an analog, integrated actuating variable quantity 104. The analog, integrated actuating variable quantity 104 is supplied to an analog-to-digital converter 114 for forming a digital, integrated actuating variable quantity 105. The digital, integrated actuating variable quantity 105 is supplied to a digital controller 115 of a gradient amplifier 116 for the output of the gradient current as controlled quantity 106 to the gradient coil 118.

Figure 2:
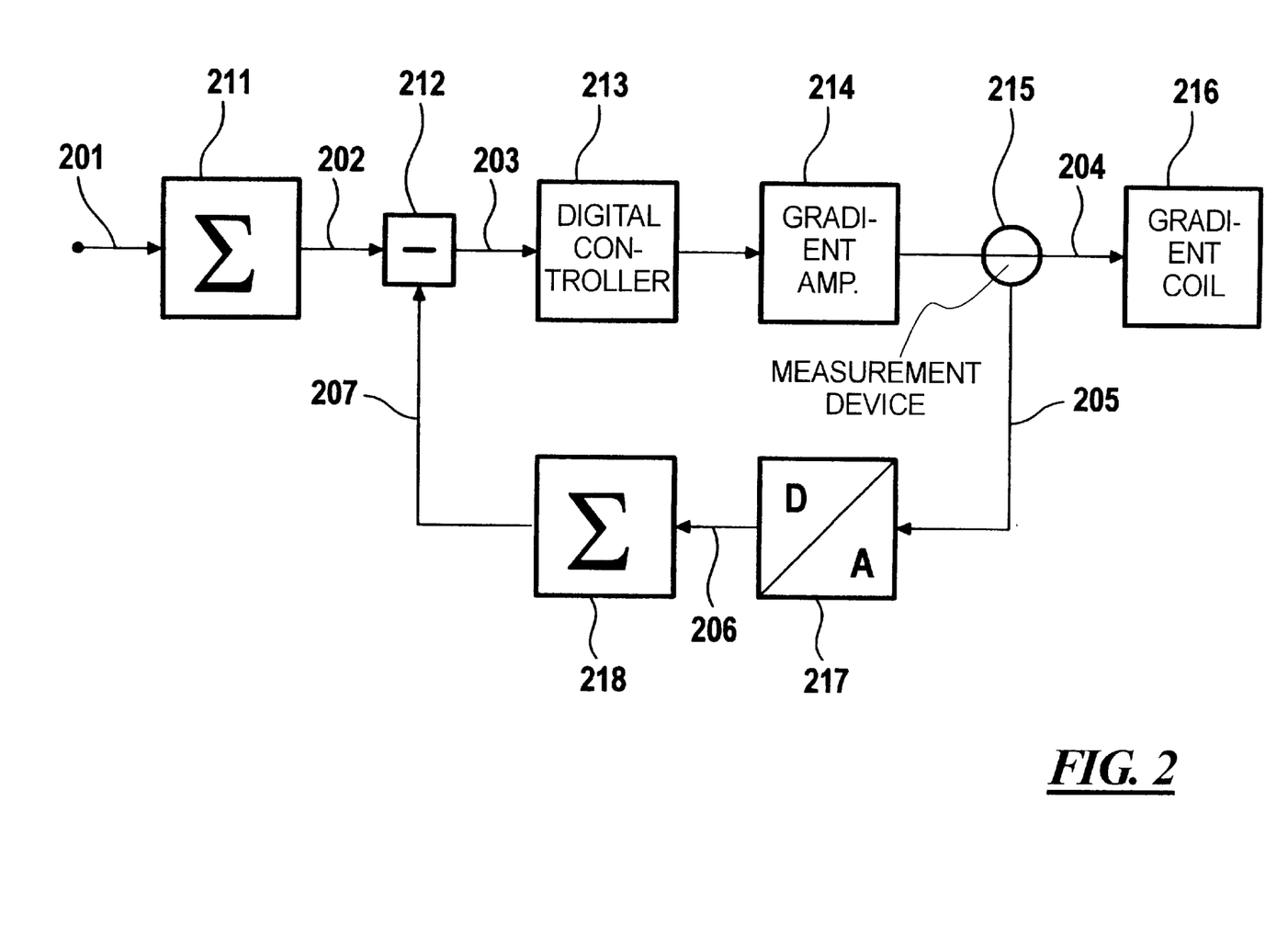
FIG. 2 is a block diagram of a control circuit device for a gradient system in a first exemplary embodiment of the invention.

As a first exemplary embodiment of the invention, FIG. 2 shows a control circuit device for a gradient system. A reference value of a gradient current, as a digital command variable 201 with a first digital resolution, is supplied to a digital integrator 211 for forming an integrated, digital command variable 202. The digital integrator 211, having a second digital resolution that is lower compared to the first, is fashioned as a summation unit. The gradient current, as an analog regulating variable 204, passes through a measurement device 215 that is fashioned for generating an analog measured quantity 205 that corresponds to the regulating variable 204. The analog measured quantity 205 is supplied to an analog-to-digital converter 217 for forming a digital measured quantity 206. The analog-to-digital converter 217 has a resolution in bits that, due to its position of the analog-to-digital converter 217 within the control loop, can be comparatively low, since errors of the analog-to-digital converter 217 are equalized as a result of its position. For forming an integrated measured quantity 207, the digital measured quantity 206 is supplied to a further digital integrator in an embodiment as summer. For forming a digital actuating variable quantity 203 from the integrated, digital command variable 202 and the integrated, digital measured quantity 207, the two latter quantities 202 and 207 are supplied to a digital subtractor 212. The digital actuating variable quantity 203 is supplied to a digital controller 213 of a gradient amplifier 214 that is fashioned for emitting the gradient current as an output to the gradient coil 216 as a regulating variable 204. In one embodiment, the digital actuating variable quantity 203 is branched and supplied to a differentiator for forming an amplitude error of the gradient current 204.

The two digital integrators 211 and 218, as summation units, exhibit a comparatively small bit depth since an overflow of the two integrators (summation units) 211 and 218 can be tolerated as long as the two integrators (summation units) 211 and 218 exhibit an identical overflow behavior. The reason for this is that the actuating variable quantity 203, as the quantity defining the control or regulation, remains unvaried as long as the subtraction in the digital subtractor 212 is implemented without taking overflows of the integrators 211 and 218 into consideration. The bit depth of the integrators 211 and 218 is merely selected of such a size that ambiguities are reliably suppressed in the event of a maximum difference between the two integrated quantities 202 and 207 and as long as the actuating variable quantity 203 is not so large that it cannot be equalized in a predetermined time interval.

Compared to the control circuit device of FIG. 1, the high-precision digital-to-analog converter 111 can be eliminated. Compared to FIG. 1, further, a true difference between the integrated quantities, i.e. current/time integrals, can be regulated or controlled. This is advantageous because, in a magnetic resonance apparatus, a spin ensemble to be investigated primarily reacts to specific gradient current/time integrals, i.e. corresponding gradient field time integrals, and is influenced by the magnitude of the gradient current only indirectly via these gradient field time integrals.

A digital resolution of the digital command variable 201 required for achieving a prescribable precision can be determined according to the following estimate: For a life expectancy of a non-equilibrium magnetization state of the spin ensemble, only a certain spin dephasing should accumulate due to quantization errors. When, for example, the life expectancy given proton imaging is set at one second and an allowed spin dephasing is set as 5° over an imaging volume of 0.5 m diameter, then the dephasing of 5°/s corresponds to a frequency $\Delta f = (5°/360°)s^{-1} = 0.0139$ Hz. Given a gyromagnetic relationship of $\gamma = 42.577$ MHz/T for proton imaging, the frequency $\Delta f$ yields a magnetic field $\Delta B = 326$ from the known relationship $\Delta f = \gamma \cdot \Delta B$. Given the assumption that the spins that cause the dephasing are disposed at the spacing of the diameter of the imaging volume from one another, a magnetic field gradient of approximately 652 pT/m results as the minimum quantization step. Given a prescribable maximum amplitude of the gradient field of, for example, $\pm 30$ mT/m, the digital resolution of the command variable is $\log_2 (60 \cdot 10^{-1}/652 \cdot 10^{-12}) = 27$ bits.

Figure 3:
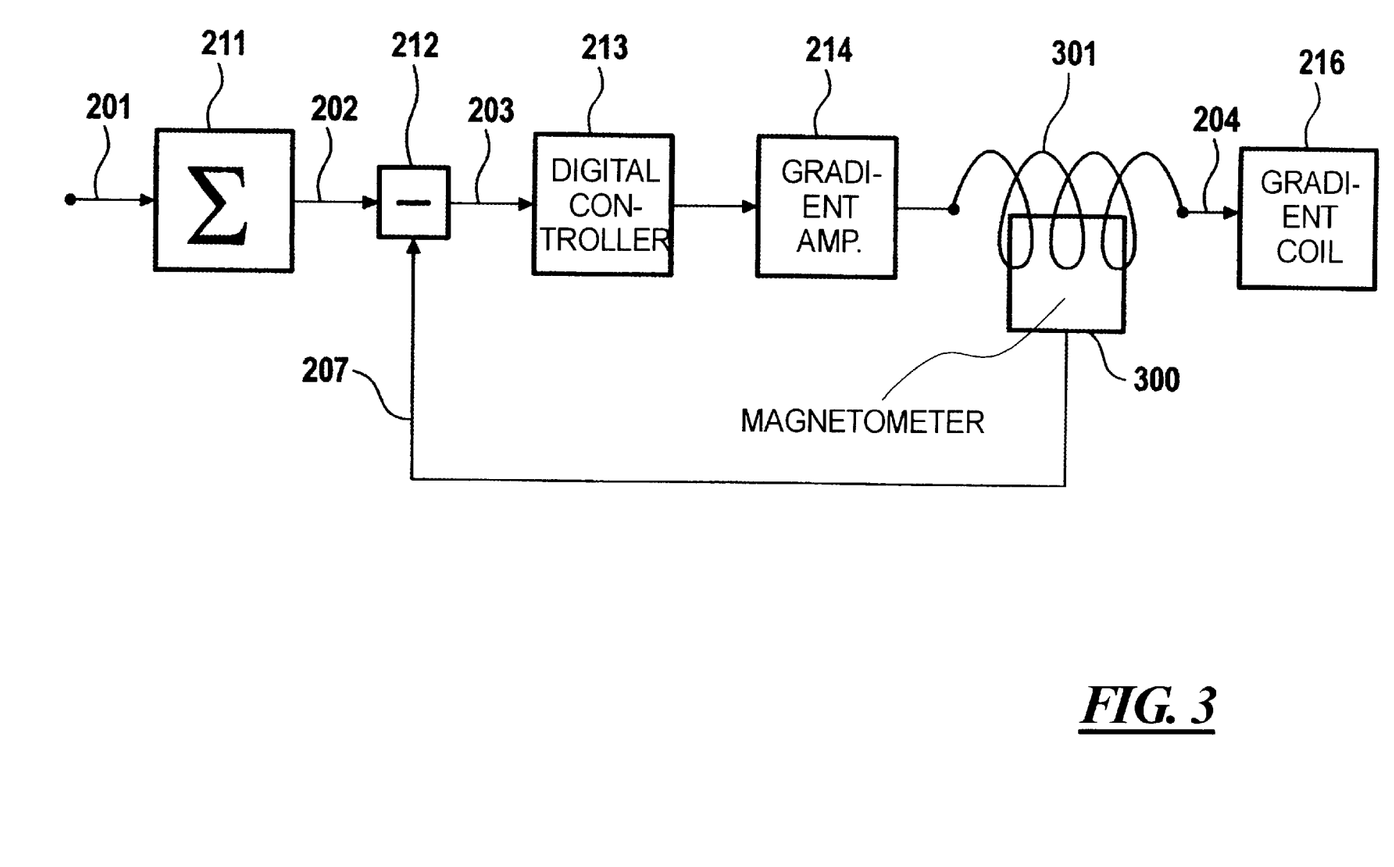
FIG. 3 is a block diagram of a control circuit device for a gradient system in a second exemplary embodiment of the invention.

As a second exemplary embodiment of the invention, FIG. 3 also shows a control circuit device for a gradient system. The control circuit device of FIG. 3 differs from that of FIG. 2 only in that a regulating variable transformer, formed by electrical coil 301 and a nuclear magnetic spin or electron spin magnetometer 300, replaces the regulating variable transformer that contains the measurement device 215, the analog-to-digital converter 217 and the digital integrator 218. Structure and functioning of the coil 301 and, in particular, of the nuclear magnetic or electron spin magnetometer 300 employed therein are explained in greater detail on the basis of the following figures.

Figure 4:
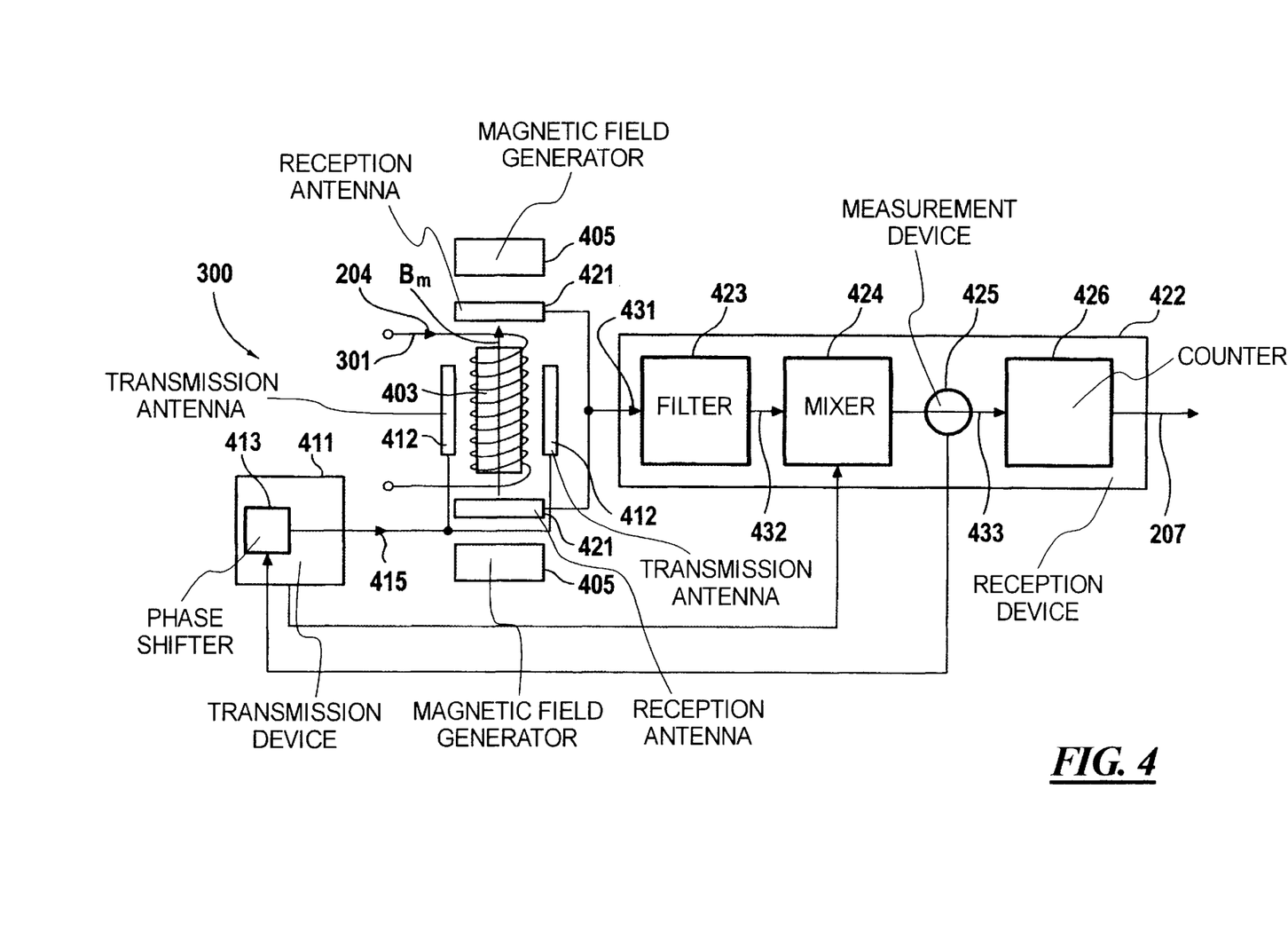
FIG. 4 is a block diagram of a nuclear magnetic spin or electron spin magnetometer in accordance with the invention.

As an exemplary embodiment of the invention, FIG. 4 shows a block diagram of a nuclear magnetic spin or electron spin magnetometer 300 for measuring a magnetic filed (shown as an arrow) with a magnetic flux density $B_m$ that is directly proportional to the gradient current 204. The magnetic field to be measured is a magnetic field that arises within a measurement volume defined by a cylindrical coil 301 through which the gradient current 204 is conducted.

As shown in FIG. 4, at least one specimen 403 is disposed in the measurement volume within the coil 301 of the magnetometer 300, the specimen 403 being composed of material that exhibits nuclear magnetic resonance of electron spin resonance. The magnetometer 300 has a transmission device 411 with transmission antennas 412 for emitting a transmission signal 415 as a radio-frequency signal as well as a reception device 422 with reception antennas 421 for receiving a mixed signal 431 from the specimen 403. The transmission antennas 412 radiate the transmission signal 415 into the specimen 403 at an essentially fixed transmission frequency $\omega_1$. The frequency $\omega_1$ is selected such that it is clearly spaced in the frequency range from a resonant frequency $\gamma \cdot B_m$ of the material of the specimen 403 that produces nuclear magnetic or electron spin resonance. The resonant frequency $\gamma \cdot B_m$ is not significantly modified due to the magnetization amplitude $B_1$ of the transmission signal 415.

The reception antennas 421 are fashioned for the reception of a mixed signal 431 from the specimen 403. In the context of frequency-resolution, the mixed signal 431 thereby contains a component at the transmission frequency $\omega_1$ and parts with mixed frequencies that derive from the resonant frequency $\gamma \cdot B_m$ is not significantly modified due to the magnetization amplitude $B_1$ of the transmission signal 415.

The reception antennas 421 are fashioned for the reception of a mixed signal 431 from the specimen 403. In the context of frequency-resolution, the mixed signal 431 thereby contains a component at the transmission frequency $\omega_1$ and parts with mixed frequencies that derive from the resonant frequency $\gamma \cdot B_m$ of the specimen 403 and the transmission frequency $\omega_1$. In the reception device 422, the mixed signal 431 is first supplied to a filter 423. The filter 423 filters a mixed signal component 432 oscillating at one of the mixed frequencies from the mixed signal 431. Thereafter, the mixed signal component 432 is supplied to a mixer 424 for mixing the filtered mixed signal 432 with a signal oscillating at the transmission frequency $\omega_1$ for eliminating the transmission frequency $\omega_1$ from the filtered mixed signal 432. To this end, the mixer 424 is connected to the transmission device 411. A signal 433 at the output of the mixer 424 and oscillating at the resonant frequency $\gamma \cdot B_m$ is supplied to a counter 426 via a measurement device 425. The counter 426 counts zero-axis crossings of the signal 433 supplied to it and for emits a corresponding count 434. The number of cycles of the signal 433 oscillating at the resonant frequency $\gamma \cdot B_m$ is thereby directly proportional to a time integral of the gradient current 204. The earlier description of the overflow behavior of the digital integrator 218 in FIG. 2 applies as well to the overflow behavior of the counter 426 in interaction with the digital integrator 211 and the digital subtractor 212.

Further, the magnetometer has a magnetic field generator 105 for generating a static magnetic field in the direction of the magnetic field to be measured, this allows a mixed signal 431 containing mixed frequencies still to be measured given a gradient current 204 equal to zero. The count 434 of the counter 426 is thereby correspondingly corrected by this static magnetic field.

In one embodiment wherein the magnetization amplitude $B_1$ of the transmission signal 415 assumes several tenths of a percent or even a few percent of the magnetic flux density of the magnetic field to be measured, a variation of the resonant frequency $\gamma \cdot B_m$ by $\gamma \cdot B_1$ is no longer negligible, so that the identified resonant frequency is to be correspondingly corrected by the magnetization amplitude $B_1$.

Figure 5:
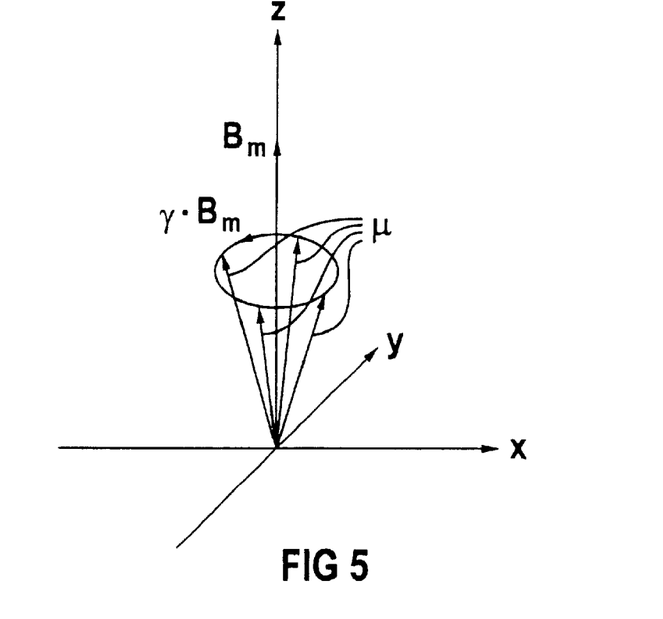
FIG. 5 illustrates a spin distribution of a specimen of the magnetometer before an activation of a transmission signal.

For explaining the functioning of an inventive magnetometer 300, FIG. 5 shows a distribution of an ensemble of spins $\mu$ of the specimen 403 of material that exhibits nuclear magnetic resonance. The spins $\mu$ precess on a conical surface with the resonant frequency $\gamma \cdot B_m$ dependent on the magnetic filed to be measured. For clarity, the precession cone is only shown in the positive z-direction, which, according to the Boltzmann distribution, represents the more highly occupied low energy spin state. The magnetic field under measurement, having the magnetic flux density $B_m$, is thereby oriented in the positive z-direction. Although all of the spins $\mu$ precess with the same resonant frequency $\gamma \cdot B_m$, they exhibit a statistically distributed phase relation relative to one another, so that a macroscopic nuclear magnetization can in fact be measured in the z-direction, but no magnetization can be detected in the x-y plane.

Figure 6:
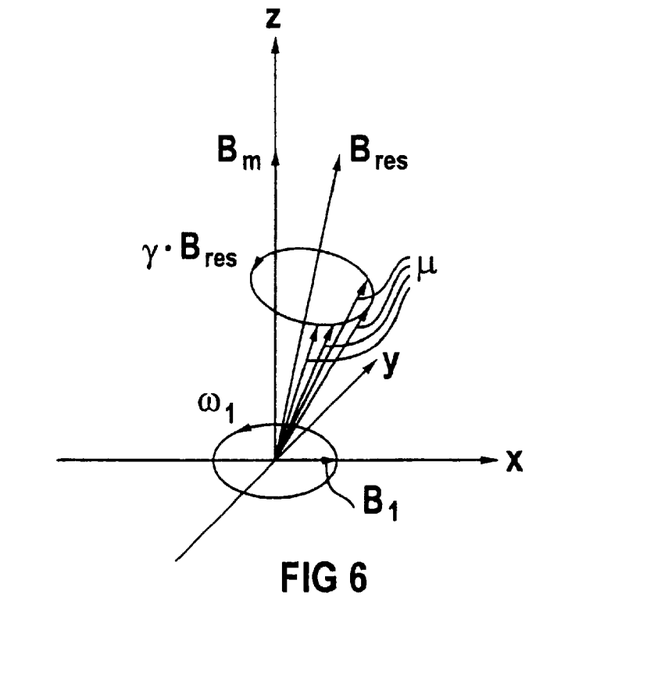
FIG. 6 illustrates a spin distribution of the specimen of the nuclear magnetic magnetometer immediately after the activation of the transmission signal.

FIG. 6 shows a spin distribution immediately after an activation of the transmission device 411, which emits a transmission signal 415 with a fixed magnetization amplitude $B_1$ and a fixed frequency $\omega_1$ in the x-y plane into the nuclear magnetic resonance-producing specimen 403. In FIG. 6, the transmssion signal 415 is represented by a vector having a magnetization amplitude $B_1$ that rotates in the x-y plane into the nuclear magnetic resonance-producing specimen 403. In FIG. 6, the transmission signal 415 is represented by a vector having the magnetization amplitude $B_1$ that rotates in the x-y plane with the frequency $\omega_1$. A resultant magnetic field $B_{res}$, which rotates around the z-axis with the frequency $\omega_1$ on a path describing a conical surface as the vector in the illustration, derives from the magnetic flux density $B_m$ to be measured as well s from the magentization amplitude $B_1$. The spins $\mu$ continue to precess around the resultant magnetic field vector $B_{res}$ rotating on a conical surface, but with a resonant frequency $\gamma \cdot B_{res}$. With the condition that the magnetization amplitude $B_1$ is far lower than the magnetic flux density $B_m$ to be measured, $\gamma B_{res} \approx \gamma \cdot B_m$ applies for the resonant frequency. Further, the activation of the transmission signal 415 leads to a phase synchronization, at least for a portion of the spins, so that a measurable macroscopic magnetization that can be measured by the reception device 422 arises in the x-y plane. As can be clearly seen on the basis of FIG. 3 the received mixed signal 431 contains components at the transmission frequency $\omega_1$ as well as components with mixed frequencies $|\omega_1 \pm \gamma \cdot B_{res}|$. Given a projection into the x-y plane, the tips of the vectors representing the spins $\mu$ thereby sweep an elliptical path due to their precessional motion with $\gamma \cdot B_{res}$. According to Kepler's Laws, this motion on the elliptical path can be described by two circular motions with radian frequencies that are equal in magnitude but oppositely directed. The frequency components $\pm \gamma \cdot B_{res}$ in the mixed frequencies unambiguously derive therefrom.

Figure 7:
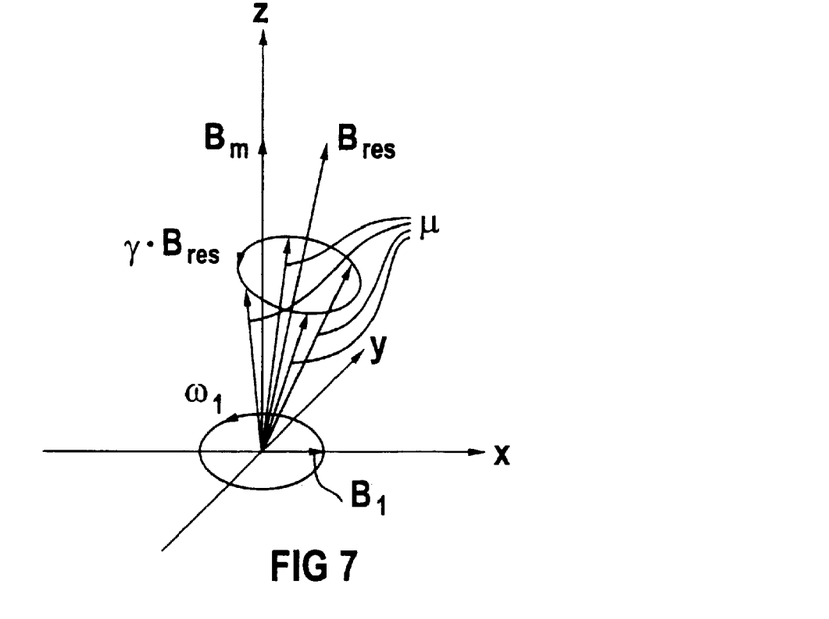
FIG. 7 illustrates a spin distribution of the specimen of the magnetometer after a time period following the activation of the transmission signal.

FIG. 7 shows a further spin distribution that arises from the spin distribution of FIG. 6 after the lapse of a specific time. As a result of relaxation processes, a loss of phase coherence of spins $\mu$ that increases with the passage of the time occurs, so that the receivable macroscopic magnetization in the x-y plane decreases more and more. The loss of phase coherence is shown in FIG. 7 in that the four spins $\mu$ precess with a large phase incoherence among one another.

Figure 8:
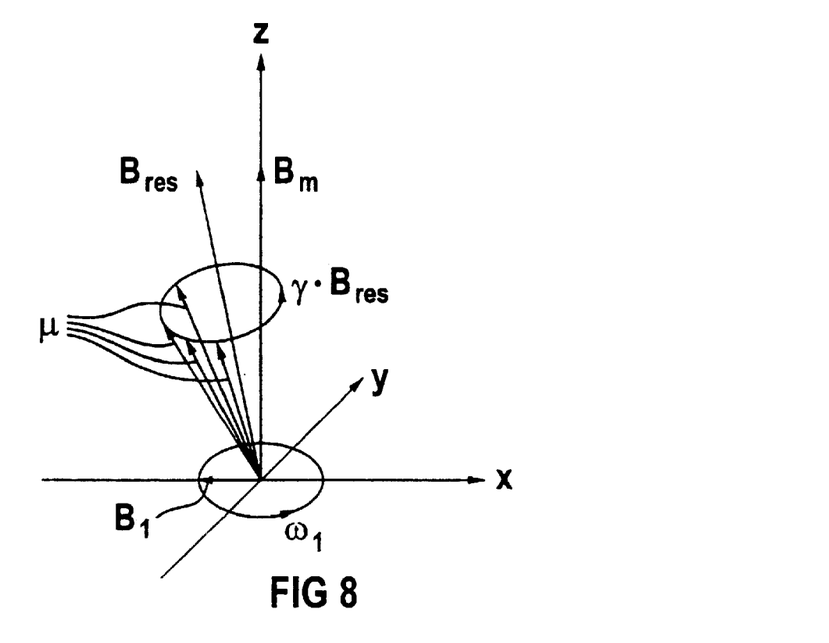
FIG. 8 illustrates a spin distribution of the specimen of the magnetometer immediately after a 180° phase shift of the transmission signal.

FIG. 8 shows another spin distribution that arises immediately after a 180° phase shift of the transmission signal 415 with respect to the spin distribution of FIG. 4. Similar to the activation of the transmission signal 415 in FIG. 6, the 180° phase shift of the transmission signal 415 leads to a phase synchronization at least in a part of the spins $\mu$, so that a clearly measurable macroscopic magnetization is again formed in the x-y plane.

Figure 9:
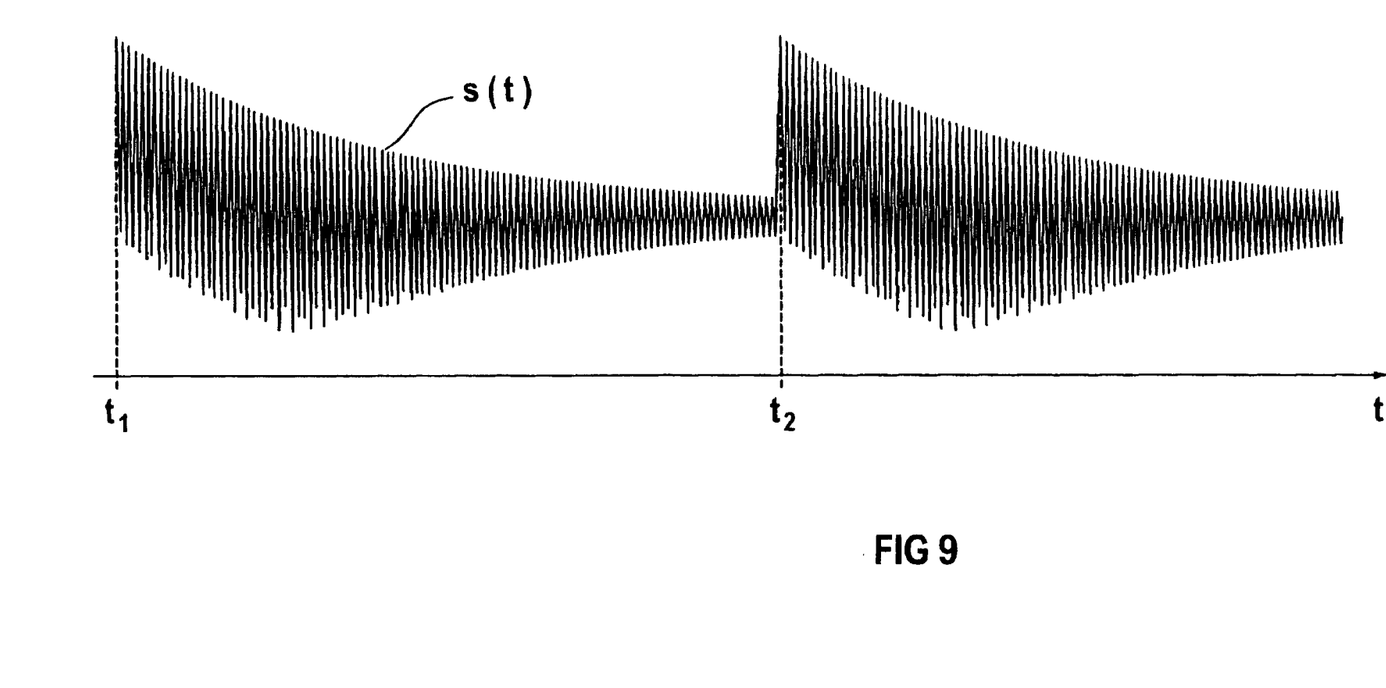
FIG. 9 shows a temporal signal curve of a measurable mixed signal obtained by the inventive magnetometer.

As an example, FIG. 9 shows a temporal signal curve s(t) of the mixed signal measurable in the x-y plane over the time t. The signal curve s(t) thereby begins at a point in time $t_1$, with the activation of the transmission signal 415. A 180° phase shift is generated in the transmission signal 415 at a second point in time $t_2$ at which an amplitude of the signal curve s(t) drops below a prescribable limit value as a consequence of relaxation processes of the specimen material, so that the spin ensemble and, thus, the signal curve s(t) is re-excited at time $t_2$.

Figure 10:
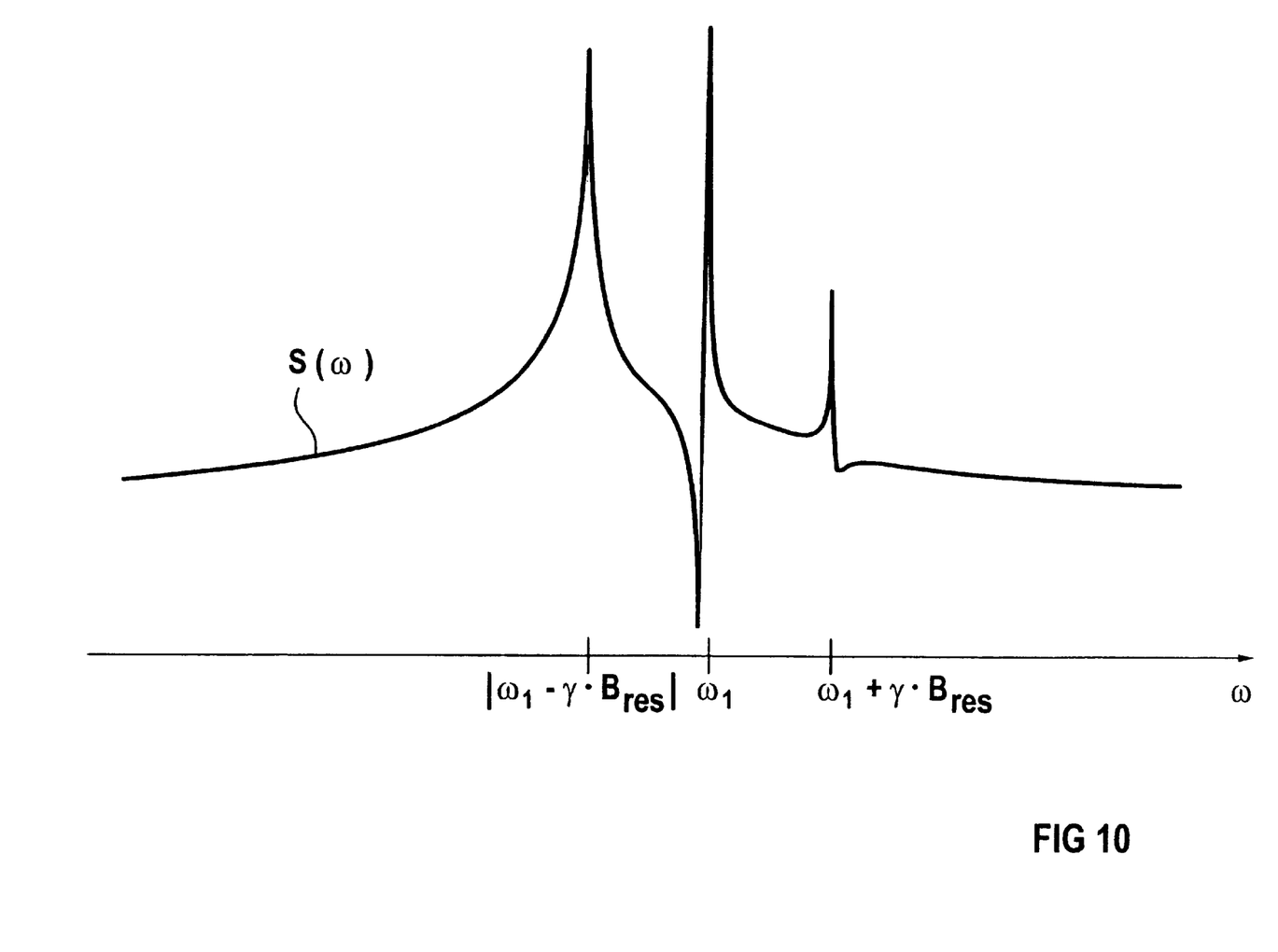
FIG. 10 shows the a spectrum of the temporal signal curve of FIG. 6.

As an example, FIG. 10 shows a spectrum $S(\omega)$ of the temporal signal curve s(t), wherein a longer time duration of the signal curve s(t) is shown than that shown in FIG. 9, and which contains four 180° phase shifts. The spectrum $S(\omega)$ is logarithmically shown in the amplitude direction. For aiding in a clear recognition of the dominant frequencies of the mixed signal 431, the magnetization amplitude $B_1$ of the transmission signal 415 is selected comparatively large at about 2% of the magnetic flux density $B_m$ of the magnetic field to be measured. The dominant frequencies of the mixed signal 431 can be clearly derived from the spectrum $S(\omega)$: these are the transmission frequency $\omega_1$ and the mixed frequencies $|\omega_1 \pm \gamma \cdot B_{res}|$ that contain the resonant frequency $\gamma \cdot B_{res}$ and the transmission frequency $\omega_1$.

Although modifications and changes may be suggested by those skilled in the art, it is the intention of the inventor to embody within the patent warranted hereon all changes and modifications as reasonably and properly come within the scope of his contribution to the art.

As an exemplary embodiment, FIG. 4 shows a sketch of the nuclear magnetic or electron spin magnetometer 300 for measuring a magnetic field (shown as arrow) with a magnetic flux density $B_m$ that is directly proportional to the gradient current 204. The magnetic field to be measured is thereby generated within the cylindrical coil 301 through which the gradient current 204 is conducted.

As shown in FIG. 4, at least one specimen 403 of the nuclear magnetic or electron spin magnetometer 300 composed of material that produces nuclear magnetic or electron spin resonance is arranged within the coil 301. The nuclear magnetic or electron spin magnetometer 300 further comprises a transmission device 411 with transmission antennas 412 for sending a transmission signal 415 as a radiofrequency signal as well as a reception device 422 with reception antennas 421 for receiving a mixed signal 431 from the specimen 403. The transmission antennas 412 thereby beam the transmission signal 415 into the specimen 403 with an essentially fixed transmission frequency $\omega_1$. The frequency $\omega_1$ is thereby selected such that it is clearly spaced in the frequency range from a resonant frequency $\gamma \cdot B_m$ of the material that produces nuclear magnetic or electron spin resonance, whereby the resonant frequency $\gamma \cdot B_m$ is dependent on the magnetic flux density $B_m$ of the magnetic field under measurement via a corresponding gyromagnetic relationship $\gamma$ of the material. Further, a magnetization amplitude $B_1$. of the transmission signal is set such that it is lower by a factor of about $10^{-3}$ than the magnetic flux density $B_m$ of the magnetic field to be measured, so that the resonant frequency $\gamma \cdot B_m$ is not significantly modified due to the magnetization amplitude $B_1$ of the transmission signal 415.

The reception antennas 421 are fashioned for the reception of a mixed signal 431 from the specimen 403. Given a frequency-resolved consideration, the mixed signal 431 thereby contains a part with the transmission frequency $\omega_1$ and parts with mixed frequencies that derive from the resonant frequency $\gamma \cdot B_m$ of the specimen 403 and the transmission frequency $\omega_1$. In the reception device 422, the mixed signal 431 is first supplied to a filter 423. The filter 423 thereby filters a mixed signal part 432 oscillating with one of the mixed frequencies from the mixed signal 431. Following thereupon, said mixed signal part 432 is supplied to a mixer 424 for mixing the filtered mixed signal 432 with a signal oscillating with the transmission frequency $\omega_1$ for eliminating the transmission frequency $\omega_1$ from the filtered mixed signal 432. To this end, the mixer 424 is correspondingly connected to the transmission device 411. A signal 433 adjacent at the output of the mixer 424 and oscillating with the resonant frequency $\gamma \cdot B_m$ is supplied to a counter 426 via a measurement device 425. The counter 426 is thereby designed for counting zero-axis crossings of the signal 433 supplied to it and for outputting the integrated, digital measured quantity 207. The plurality of cycles of the signal 433 oscillating with the resonant frequency $\gamma \cdot B_m$ is thereby directly proportional to a time integral of the gradient current 204. What was stated about the digital integrator 218 in FIG. 2 thereby correspondingly applies to an overflow behavior of the counter 426 in interaction with the digital integrator 211 and the digital subtractor 212.

The measurement device 425 is fashioned for acquiring an amplitude of the signal 433 oscillating with the resonant frequency $\gamma \cdot B_m$ and is connected to means 413 within the transmission device 411 for generating a 180° phase shift of the transmission signal 415. When said amplitude thereby falls below a prescribable limit, then a 180° phase shift is inserted into the transmission signal 415, so that the spin collective of the specimen 403 is rekindled. In another embodiment, said rekindling of the spin collective is not amplitude-dependent but respectively occurs periodically after expiration of a permanently prescribable time duration.

Further, the nuclear magnetic or electron spin magnetometer 300 comprises a magnetic field generator 4105 for generating a static magnetic field in the direction of the magnetic field to be measured, as a result whereof a mixed signal 431 containing mixed frequencies can also be measured given a gradient current 204 equal to zero. A counter reading of the counter 426 is thereby correspondingly corrected by said static magnetic field.

In one embodiment wherein the magnetization amplitude $B_1$ of the transmission signal 415 assumes several tenths of a percent or even a few percent of the magnetic flux density of the magnetic field to be measured, a variation of the resonant frequency $\gamma \cdot B_m$ by $\gamma \cdot B_1$ is no longer negligible, so that the identified resonant frequency is to be correspondingly corrected by the magnetization amplitude $B_1$.

For explaining the functioning of an inventive nuclear magnetic magnetometer 300, FIG. 5 shows a distribution of an ensemble of spins $\mu$ of the specimen 403 of material that produces nuclear magnetic resonance. The spins $\mu$ thereby precess on a conical surface with the resonant frequency $\gamma \cdot B_m$ dependent on the magnetic field to be measured. For reasons of clarity, the precession cone is only shown in positive z-direction, which, according to the Boltzmann distribution, represents the more highly occupied spin condition with low energy. The magnetic field under measurement and having the magnetic flux density $B_m$ is thereby oriented in positive z-direction. Although all of the spins $\mu$ precess with the same resonant frequency $\gamma \cdot B_m$, they exhibit a statistically distributed phase relation relative to one another, so that a macroscopic nuclear magnetization can in fact be measured in z-direction, but no magnetization can be detected in the x-y plane.

FIG. 6 shows a spin distribution immediately after an activation of the transmission device 411, which beams a transmission signal 415 with a fixed magnetization amplitude $B_1$ and fixed frequency $\omega_1$ in the x-y plane into the nuclear magnetic resonance-producing specimen 403. In FIG. 6, the transmission signal 415 is presented by a vector having the magnetization amplitude $B_1$, that orbits in the x-y plane with the frequency $\omega_1$. A resultant magnetic field $B_{res}$, which orbits around the z-axis with the frequency $\omega_1$ on a path describing a conical surface as vector in the illustration, derives from the magnetic flux density $B_m$ to be measured as well as from the magnetization amplitude $B_1$. The spins p continue to precess around the resultant magnetic field vector $B_{res}$ orbiting on a conical surface, but with a resonant frequency $\gamma \cdot B_{res}$. Upon condition that the magnetization amplitude $B_1$ is far lower than the magnetic flux density $B_m$ to be measured, $\gamma \cdot B_{res} \approx \gamma \cdot B_m$ applies for the resonant frequency. Further, the activation of the transmission signal 415 leads to a phase synchronization, at least in a part of the spins, so that a measurable macroscopic magnetization that can be measured by the reception device 422 forms in the x-y plane. It can thereby be clearly appreciated on the basis of FIG. 6 that the received mixed signal 431 contains parts with the transmission frequency $\omega_1$ as well as parts with mixed frequencies $|\omega_1 \pm \gamma \cdot B_{res}|$. Given a projection into the x-y plane, the tips of the vectors representing the spins $\mu$ thereby sweep an elliptical path in view of their precessional motion with $\gamma \cdot B_{res}$. According to Kepler's Laws, said motion on the elliptical path can be described by two circular motions with radian frequencies that are equal in amount but oppositely directed. The frequency parts $\pm \gamma \cdot B_{res}$ in the mixed frequencies clearly derive therefrom.

FIG. 7 shows a further spin distribution that is established from the spin distribution of FIG. 6 after the lapse of a specific time. As a result of relaxation processes, a loss of phase coherence of the spins $\mu$ that increases with the passing of the time occurs within the lapse of time, so that the receivable macroscopic magnetization in the x-y plane decreases more and more. The loss of phase coherence is shown in FIG. 7 in that the four spins u precess with great phase incoherence among one another.

FIG. 8 shows another spin distribution that is established immediately after a 180° phase shift of the transmission signal 415 with respect to the spin distribution of FIG. 7. Similar to the activation of the transmission signal 415 in FIG. 6, the 180° phase shift of the transmission signal 415 leads to a phase synchronization at least in a part of the spins $\mu$, so that a clearly measurable macroscopic magnetization is again formed in the x-y plane.

By way of example, FIG. 9 shows a temporal signal curve s(t) of the mixed signal 431 measurable in the x-y plane over the time t. The signal curve s(t) thereby begins at a point in time $t_1$ with the activation of the transmission signal 415. A 180° phase shift is generated in the transmission signal 415 at a second point in time $t_2$ at which an amplitude of the signal curve s(t) drops below a prescribable limit value as a consequence of relaxation processes of the specimen material, so that the spin collective and, thus, the signal curve s(t) is rekindled at time $t_2$.

As an example, FIG. 10 shows a spectrum S($\omega$) of the temporal signal curve s(t), whereby a longer time duration of the signal curve s(t) than shown in FIG. 9 and containing four 180° phase shifts is analyzed. The spectrum S($\omega$) is logarithmically shown in amplitude direction. For instructive reasons, the magnetization amplitude $B_1$ of the transmission signal 415 is selected comparatively great at about 2% of the magnetic flux density $B_m$ of the magnetic field to be measured. The dominant frequencies of the mixed signal 431 can thereby be clearly derived from the spectrum S($\omega$): these are the transmission frequency $\omega_1$ and the mixed frequencies $|\omega_1 \pm \gamma \cdot B_{res}|$ that contain the resonant frequency $\gamma \cdot B_{res}$ and the transmission frequency $\omega_1$.

Although modifications and changes may be suggested by those skilled in the art, it is the intention of the inventor to embody within the patent warranted hereon all changes and modifications as reasonably and properly come within the scope of his contribution to the art.

I claim as my invention:

1. A control circuit device for a gradient system of a magnetic resonance apparatus, comprising:
   a command variable transformer to which a command variable is supplied and that generates a first output quantity that corresponds to a time integration of the command variable;
   a regulating variable transformer to which a regulating variable is supplied and that generates a second output quantity that corresponds to a time integration of the regulating variable;

a comparator to which the two output quantities are supplied and that generates an actuating variable quantity from the output quantities; and a controller to which the actuating variable quantity is supplied and that generates a manipulated variable with which the regulating variable is controlled via a controlled system.

2. A control circuit device as claimed in claim 1, wherein the regulating variable is a gradient current of a gradient coil of the gradient system.

3. A control circuit device as claimed in claim 1, wherein the command variable is a digital quantity with a first digital resolution.

4. A control circuit device as claimed in claim 2, wherein the command variable transformer is a digital integrator with a second digital resolution.

5. A control circuit device as claimed in claim 4, wherein the second resolution is lower than the first resolution.

6. A control circuit device as claimed in claim 1, wherein the comparator is a digital subtractor.

7. A control circuit device as claimed claim 1, wherein the regulating variable transformer has a regulating variable pickup through which the regulating variable is looped and that emits a digital measured quantity that corresponds to the regulating variable, and a further digital integrator to which the digital measured quantity is supplied and that emits the second output quantity.

8. A control circuit device as claimed in claim 7, wherein the digital integrator and the further digital integrator exhibit identical overflow behavior.

9. A control circuit device as claimed in claim 8, wherein the comparator is a digital subtractor for processing the two output quantities independently of the overflow behavior of the digital integrator and the further digital integrator.

10. A control circuit device as claimed in claim 9 wherein at least one of the digital integrators and the further digital integrator is a summation unit.

11. A control circuit device as claimed in claim 1, whereby the regulating variable transformer is a magnetometer for measuring a magnetic field associated with nuclear magnetic spins or electron spins.

12. A control circuit device as claimed in claim 11, wherein the magnetometer comprises:

a measurement volume adapted to receive a specimen of a material that exhibits resonance selected from the group consisting of nuclear magnetic resonance and electron spin resonance, said material having a resonant frequency that is dependent on a magnetic flux density of a magnetic field, associated with the resonance, which is to be measured;

a transmission device disposed for emitting a transmission signal into said specimen in said measurement volume at a selected transmission frequency having a frequency spacing from said resonant frequency; and a reception device disposed for receiving a mixed signal from said specimen containing mixed frequencies including a resonant frequency and the transmission frequency, said reception device filtering out said resonant frequency from said mixed frequencies in said mixed signal to obtain a filtered out signal which is representative of said magnetic flux density.

13. A control circuit device as claimed in claim 12 wherein said magnetometer comprises an electrical coil having a current flow therein, said coil having an interior defining said measurement volume and said current flowing therein producing said magnetic field in said measurement volume.

14. A control circuit device as claimed in claim 12, wherein the reception device includes a counter with which cycles of a signal that oscillates with the resonant frequency are counted, said counter emitting the second output quantity.

15. A control circuit device are claimed in claim 14, wherein the counter and the digital integrator exhibit identical overflow behavior.

16. A control circuit device as claimed in claim 15, wherein the comparator is a digital subtractor for processing the two output quantities independently of the overflow behavior of the counter and the digital integrator.

17. A control circuit device as claimed in claim 12 wherein said transmission device emits said transmission signal with a magnetization amplitude that is smaller by a factor of approximately $10^3$ than said magnetic flux density.

18. A control circuit device as claimed in claim 12 wherein said magnetometer further comprises a magnetic field generator which generates a static magnetic field in said measurement volume that prepolarizes said specimen.

19. A control circuit device as claimed in claim 12 wherein said reception device comprises a filter for filtering a mixed signal component from said mixed signal at one of said mixed frequencies.

20. A control circuit device as claimed in claim 19 wherein said reception device further comprises a mixer, supplied with said mixed signal component, for acquiring a signal at said resonant frequency from a signal at said transmission frequency and said mixed signal component.

21. A control circuit device as claimed in claim 12 wherein said transmission device comprises a phase shifter for generating at least 180° phase shift of said transmission signal.

22. A control circuit device as claimed in claim 21 wherein said transmission device emits said transmission signal at an initial time, and wherein said phase shifter generates said 180° phase shift at a predetermined time after said initial time.

23. A control circuit device as claimed in claim 21 wherein said mixed signal has an amplitude, and wherein said phase shifter generates said 180° phase shift dependent on the amplitude of the mixed signal.

* * * * *